United States Patent [19]
Keller

[11] Patent Number: 4,582,375
[45] Date of Patent: Apr. 15, 1986

[54] MODULE HOLDER

[75] Inventor: Roman Keller, Neunkirchen/Brand, Fed. Rep. of Germany

[73] Assignee: Siemens Aktiengesellschaft, Munich and Berlin, United Kingdom

[21] Appl. No.: 598,568

[22] Filed: Apr. 11, 1984

[30] Foreign Application Priority Data

Apr. 25, 1983 [DE] Fed. Rep. of Germany ....... 3314871

[51] Int. Cl.[4] .............................................. H05K 7/14
[52] U.S. Cl. .................................. 339/17 LM; 361/415
[58] Field of Search ........................ 361/412, 413, 415; 339/17 M, 17 LM, 91 R; 211/41; 24/563

[56] References Cited

U.S. PATENT DOCUMENTS 3,225,952 12/1965 Stiles ...................................... 24/563
3,803,670 4/1974 Johnson ............................... 411/508

FOREIGN PATENT DOCUMENTS 2913499 10/1980 Fed. Rep. of Germany ...... 361/415
2040590 8/1980 United Kingdom ................ 361/415

Primary Examiner—Neil Abrams
Attorney, Agent, or Firm—F. W. Powers; J. L. James

[57] ABSTRACT

The invention relates to a module holder for holding electronic modules in which two lateral parts are screwed to four connecting pieces. A printed circuit board is provided for the backwall wiring and to facilitate assembly and disassembly, it is clamped to the rear connecting pieces of the module holder with at least one elastic force accumulator. A suitable elastic force accumulator can be, for example, the resilient leg of a U-shaped plastic part, with the other leg being fastened form-lockingly on the corresponding connecting piece. Preferably this plastic part extends as a holding bar over the full length of the connecting piece, so the necessary air and creepage distances are obtained in a simple manner.

17 Claims, 4 Drawing Figures

MODULE HOLDER

BACKGROUND OF THE INVENTION

The invention relates to a module holder for holding electronic modules, having two lateral parts and four connecting pieces, in which the backwall wiring includes a printed circuit board which is attached to the two rear connecting pieces in a mechanically detachable manner.

Module holders are disclosed in Siemens-Zeitschrift 46 (1972), at pages 277 to 279. In existing module holders the lateral parts are screwed to four connecting pieces at the corners. Fitted into the backwall of these module holders are male or female connectors ("spring or knife strips") of multi-pole plug connectors, whose wiring-side contact pins form the wiring field of the module holder. Such male and female connectors are also disclosed in Siemens-Zietschrift 46 (1972), at pages 279 and 280. The electrical connections in this wiring field may be produced with discrete wiring or by circuit board wiring (see for example from Siemens-Zietscrift 46 (1972), pages 286 to 288). Discrete wiring is being replaced increasingly by wiring with printed circuit boards, referred to as back panels or platters. These platters are normally attached to the connecting pieces of the module holder with screws. For maximum mechanical strength, the distances between the screws are relatively small. Also, the copper area of the printed circuit board is interrupted at the screw points. This face must be taken into consideration in the designing of the circuit board. Additionally, due to different temperatures during manufacture, transport and use, the dimensional differences between the module holder backwall and the platter may increase to over 1 mm, resulting in high mechanical stresses and possibly malfunctions in view of the small distances between screws.

SUMMARY OF THE INVENTION

The object of the invention is to provide a module holder of the type mentioned above in which the detachable connection between the platter and the module holder can be accomplished without any additional cost for special personnel, while at the same time avoiding malfunctions of the circuit board.

According to the invention, this object is accomplished by clamping the circuit board at each connecting piece with at least one U-shaped plastic part.

In the module holder the platter can be mounted on the backwall quickly and if necessary removed again for maintenance work. In doing so, the copper areas of the printed circuit board remain unaffected, at least when using U-shaped part made of plastic, and at different temperatures so mechanical stresses do not occur.

Preferably each U-shaped plastic part has a resilient leg clamping against the circuit board, and has the other leg fastened to the corresponding connecting piece. The circuit board can then be clamped between the two legs.

For this form of a clamp an extruded plastic part can be used which is relatively easy and inexpensive to manufacture. The platter is connected force-lockingly with this plastic part, as it is wedged between the legs of the U-shaped section. A lateral movement for compensation of thermal stresses is possible, however, as the platter is inserted into the U-section.

Preferably the plastic part which acts as a holding bar, extends over the full length of the connecting piece. Therefore, not only the mechanical strength of the connection between the platter and the module holder is optimized, but also the maintaining of the required air and creepage distances is facilitated.

To increase the strength of the connection, the resilient leg of the plastic part may be provided at its sides toward the circuit board with lugs which form-lockingly engage recesses of the circuit boards.

In one embodiment the plastic part is fitted on the connecting piece by positive interlock. With such a positive interlock not only is mounting facilitated, but also air and creepage distances, which could appear because of small distances between screws if the holding bar were screwed to the connecting piece, are avoided.

For the positive interlock there may be formed, on the leg abutting on the connecting piece, a projecting resilient piece provided with a catch which engages one edge of the connecting piece from behind. In this embodiment, the holding bar is simply snapped onto the connecting piece for assembly, and for maintenance work it is easy to remove the holding bar from the connecting piece. Moreover, the air and creepage distances between the conductor tracks of the platter and the connecting piece are lengthened by the piece.

The leg abutting the connecting piece may have, in the area of contact with the connecting piece, a lug which engages form-lockingly in a recess of the connecting piece. This lug serves as an abutment in the locking of the holding bar and advantageously extends over the full length of the plastic part.

For current supply, metal parts may be inserted in the side toward the circuit board of at least one of the legs and be pressed against conductor tracks of the clamped circuit board. In this embodiment not only is the platter retained at the module holder in a simple manner, but it serves at the same time for current supply of the modules inserted into the module holder.

Other features and advantages of the present invention will become apparent from the following detailed description, and from the claims.

For a full understanding of the present invention, reference should now be made to the following detailed description and to the accompanying drawings.

BRIEF DESCRIPTION OF THE DRAWINGS

The module holder of the invention is further explained by way of example with reference to FIGS. 1 to 4 in which identical components are provided with identical reference symbols.

DETAILED DESCRIPTION

Figure 1:
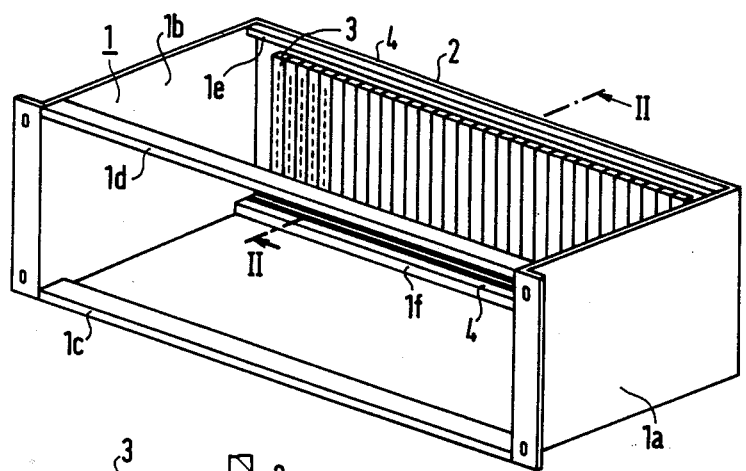
FIG. 1 shows a perspective view of the module holder.

FIG. 1 shows module holder 1 which has side panels 1a and 1b connected with the cross pieces or cross bars 1c and 1d, 1e and 1f which are perpendicular to 1a and 1b. Backwall wiring is provided by a printed circuit board of platter 2, in which the fastened male or female connectors 3 of a multi-pole plug connector for indirect plugging of printed circuits and which are carried by platter 2. The male and female connectors 3 of the multi-pole plug connector are indicated only schematically in the figure. In such commercial module holders, platter 2 is attached to connecting pieces 1e and 1f by screws. The disadvantage of this type of attachment, namely small distances between screws because of the required mechanical strength and hence difficulties in maintaining the necessary air and creepage distances, interruptions of the copper coating of the platter in the area of the screws, and possible malfunctions due to thermal stresses, have already been discussed in detail. To avoid these disadvantages, in the module holder shown in FIG. 1, platter 2 is clamped on connecting pieces 1e and 1f with holding bars 4 made of plastic.

Figure 2:
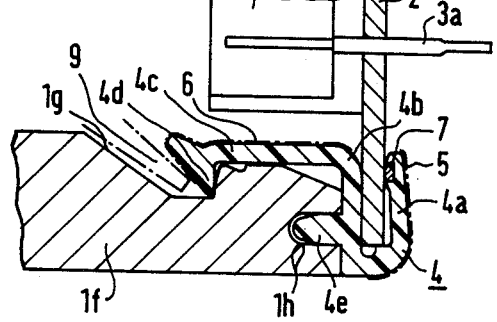
FIG. 2 shows a cross-sectional view taken along line II—II of FIG. 1.

Referring to FIG. 2, plug connector 3 is attached to platter 2; terminal pins 3a project from the backwall of platter 2 and form an additional wiring field of module holder 1. Platter 2 is locked on connecting piece 1f of module holder 1 with a holder bar 4. The holding bar is a U-shaped section which can be an extruded plastic part. One leg 4b applies force against connecting piece 1f. The second leg 4a is resilient and serves as a force accumulator. Platter 2 is inserted between legs 4a and 4b and interlocks with this plastic part. The holding bar is attached form-lockingly on connecting piece 1f. To this end it is provided with a resilient piece 4c, which projects at the end of leg 4b. Piece 4c has a catch 4d which engages the connecting piece 1f from behind and presses leg 4b against connecting piece 1f. In this embodiment catch 4d engages connecting piece 1f from behind in a groove 1g in the connecting piece. In addition, a lug 4e formed on leg 4b engages form-lockingly in a recess 1h in connecting bar 1f. The lug 4e, which preferably extends over the full length of plastic part 4, prevents a displacement of holding bar 4 in the plane of the drawing and serves as an additional abutment for the interlock by means of catch 4d, so that plastic part 4 is locked on connecting piece 1f.

In this embodiment, plastic part 4 is formed as a bar which extends over the full length of platter 2 and of the connecting pieces 1f, 1e. For attaching platter 2 it may suffice simply to lock one or two shorter plastic parts 4 at each connecting bar 1f, 1e. The mechanical attachment of platter 2 is of course increased in a holding bar 4, which in accordance with the embodiment, supports platter 2 over its entire length. With such a holding bar 4, moreover, the copper coating of platter 2 is sufficiently insulated from connecting bar 1f. The dash-dot lines shown in FIG. 2 indicate the air and creepage distances which one obtains with the embodiment shown and which are sufficient for electrical insulation of platter 2. As platter 2 is inserted into plastic part 4, it need not be modified mechanically. This means no boreholes have to be provided in the platter. The areas without boreholes can therefore be provided with conductor tracks, which can be used for example, for supplying current to the modules. In the embodiment shown in FIG. 2, a current lead for such conductor tracks via a plastic bar is provided. Metal parts 7; are inserted into resilient legs 4a, and each part is pressed against a conductor track of platter 2. Via these metal parts 7, which are contacted directly on partially etched conductor tracks within the printed circuit of the platter, supply current can be carried. The electrical connection to such pressed-in metal parts 7 can be effected for example through bores in plastic leg 4a. It should be mentioned also that platter 2 can physically expand in a direction perpendicular to the plane of the drawing, so that compensation for thermal stresses is ensured.

Figure 3:
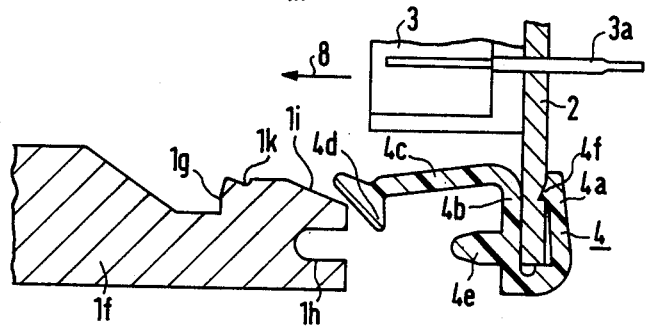
FIGS. 3 and 4 show the assembly/disassembly of the major components in FIG. 2.
Figure 4:
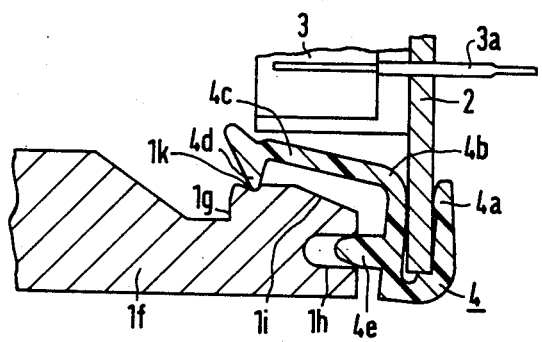

FIGS. 3 and 4 demonstrate the ease of mounting platter 2 on module holder 1. The section taken according to FIGS. 3 and 4 is the same as that according to FIG. 2. In FIG. 3, platter 2 is prepared for mounting in module holder 1; that is, its two long sides are inserted in holding bars 4. Then platter 2 is inserted in the direction of arrow 8 into the backwall of module holder 1. Because of the oblique approach edges of catches 4d, resilient piece 4c is bent upward, and the catch slips over the approach surface of the connecting piece until it snaps into groove 1g. This clipping in can be further facilitated by an oblique approach surface 1i of connecting pieces 1e, 1f. In the embodiment shown in FIGS. 3 and 4, connecting piece 1f has an additional small groove 1k. The catch 4d snaps into this groove 1k for an intermediate assembly/disassembly position. The figures show also how the platter moves in the U-shaped section of the holding bar during insertion. It is seen therefrom that mechanical damage of the platter during its assembly or disassembly need not result.

For disassembly of the platter it is sufficient to remove catch 4d from its locking position. This can be done, as indicated in FIG. 2, by means of screwdriver 9, with which the catch is pushed up. Especially for disassembly the intermediate position obtained with the additional groove 1k is remarkable, because in this intermediate position platter 2 is retained and therefore the disassembly of platter 2 can be carried out by one person.

Another embodiment is shown in FIG. 3, where resilient leg 4a of plastic part 4 is provided with a sawtooth-shaped nub 4f, which interlocks in a matching recess in platter 2 and further improves the positive coupling between platter 2 and holding bar 4. A disadvantage of this embodiment however, is that the surface of the platter must be provided with recesses, which interrupts the copper coating.

There has thus been shown and described a novel module holder which fulfills all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. In a module holder for holding electronic modules, having right and left lateral panels, top and bottom front connecting pieces, top and bottom rear connecting pieces mounted perpendicular to the lateral panels and extending between the panels, and a printed circuit board for the backwall wiring which is detachably attached to the two rear connecting pieces, the improvement wherein the circuit board is attached to both rear connecting pieces with at least two U-shaped plastic parts; each U-shaped plastic part having a pair of legs for attaching the circuit board therebetween with a vertically extending portion of one of said legs located horizontally between a frontwardly directed face of the circuit board and an associated one of the connecting pieces, a frontwardly directed extension from said one leg of each plastic part being detachably attached to said connecting piece to which it is associated.

2. The module holder according to claim 1, wherein each U-shaped plastic part has a resilient leg for detachably attaching to the backwall circuit board and another leg which is detachably attached to the respective rear connecting piece, the circuit board being clamped between the two legs.

3. The module holder according to claim 1, wherein the plastic part extends as a holding bar over the full length of the connecting piece.

4. The module holder according to claim 2, wherein the resilient leg is provided on its side toward the circuit board with lugs which interlock in recesses of the circuit board.

5. The module holder according to claim 2, wherein the plastic part is locked at the connecting piece form-lockingly.

6. The module holder according to claim 5, wherein from the leg with the frontwardly directed extension attached to said connecting piece to which it is associated, a resilient piece projects which is provided with a catch which engages an edge of said associated connecting piece from behind.

7. The module holder according to claim 6, wherein the leg abutting on the connecting piece has in the area of contact with the connecting piece a lug which engages form-lockingly in a recess of the connecting piece.

8. The module holder according to claim 7, wherein the lug extends in rail fashion over the total length of the U-shaped plastic part.

9. The module holder according to claim 1, further comprising metal parts for electrical current connections inserted into the side toward the circuit board of at least one of the legs and pressed against the clamped circuit board.

10. A module holder for holding electronic modules comprising:
- a right and a left side panel;
- a top and a bottom front connecting piece; each connected between said side panels;
- a top and a bottom rear connecting piece, each having two grooves on the surface facing inward toward the other rear connecting piece and a groove rearwardly facing away from the front connecting pieces, all said grooves running the length thereof, connected to said side panels;
- a printed circuit board having at least one module connector providing the backwall wiring thereof;
- a bottom U-shaped plastic section slamping along a bottom edge of said printed circuit board with a resilient leg;
- a top U-shaped plastic section clamping along a top edge of said printed circuit board with a resilient leg; and
- a second leg on each said top and bottom U-shaped plastic sections detachably engaging said printed circuit board to said top and bottom rear connecting pieces respectively, the second legs on each said top and bottom U-shaped plastic sections each including an extension for engaging in an alternative manner one of said inwardly facing grooves on said top and bottom rear connecting pieces respectively to provide selectable alternative positions of said circuit board.

11. A module holder according to claim 10, wherein said resilient legs and said second legs of each said U-shaped plastic section, extend over the total length thereof.

12. A module holder according to claim 10, further comprising:
- a lug, integrally formed on said second leg on the total length of each said U-shaped plastic section for fitting into said rear facing groove of each said rear connecting piece to help lock said backwall in place during engagement.

13. A module holder according to claim 12, wherein said printed circuit board has a recess therein; further comprising a lug integrally formed on each said U-shaped plastic section resilient leg engaging said printed circuit board recess.

14. A module holder according to claim 11, wherein said top and bottom U-shaped plastic sections are form-lockingly engaged with said respective top and bottom rear connection pieces.

15. A module holder according to claim 12, wherein said top and bottom U-shaped plastic sections are form-lockingly engaged with said respective top and bottom rear connection pieces.

16. A module holder according to claim 14, further comprising a catch integrally formed on said second legs of said top and bottom U-shaped plastic sections each engaging one of the inward facing grooves of the respective top and bottom rear connecting pieces during engagement.

17. A module holder according to claim 10, further comprising a metal part inserted onto said resilient leg on the side facing the printed circuit board of at least one of said U-shaped plastic sections and forcefully contacting said circuit board for connecting to an electrical current supply.

* * * * *